United States Patent [19]

Rao et al.

[11] 4,286,178
[45] Aug. 25, 1981

[54] SENSE AMPLIFIER WITH DUAL PARALLEL DRIVER TRANSISTORS IN MOS RANDOM ACCESS MEMORY

[75] Inventors: G. R. Mohan Rao; Lionel S. White, Jr., both of Houston, Tex.

[73] Assignee: Texas Instruments Incorporated, Dallas, Tex.

[21] Appl. No.: 914,646

[22] Filed: Jun. 12, 1978

[51] Int. Cl.³ .................. H03K 5/24; H03K 3/353; G11C 7/06
[52] U.S. Cl. ........................... 307/355; 307/DIG. 3; 365/205
[58] Field of Search ............... 307/238, 279, 355, 362, 307/DIG. 3; 365/203, 204, 205, 207, 208

[56] References Cited

U.S. PATENT DOCUMENTS

| | | | |
|---|---|---|---|
| 3,983,412 | 9/1976 | Roberts et al. | 307/DIG. 3 X |
| 4,039,861 | 8/1977 | Heller et al. | 307/355 |
| 4,045,783 | 8/1977 | Harland | 307/DIG. 3 X |
| 4,050,061 | 9/1977 | Kitagawa | 307/DIG. 3 X |
| 4,069,475 | 1/1978 | Boettcher | 307/DIG. 3 X |
| 4,081,701 | 3/1978 | White, Jr. et al. | 307/355 |
| 4,087,704 | 5/1978 | Mehta et al. | 307/DIG. 3 X |
| 4,110,841 | 8/1978 | Schroeder | 307/DIG. 3 X |
| 4,119,870 | 10/1978 | Zibert | 307/DIG. 3 X |
| 4,150,311 | 4/1979 | Matsuda et al. | 307/DIG. 3 X |

FOREIGN PATENT DOCUMENTS 2734987 2/1978 Fed. Rep. of Germany .... 307/DIG. 3

OTHER PUBLICATIONS

Gionis, Ebel and Gegitz, –*IEEE Journal of Solid-State Circuits;* vol.-SC-10, No. 5, pp. 262-267; 10/1975.

*Primary Examiner*—Larry N. Anagnos
*Attorney, Agent, or Firm*—John G. Graham

[57] ABSTRACT

A random access memory device of the MOS integrated circuit type employs an array of rows and columns of one-transistor storage cells with a bistable sense amplifier circuit at the center of each column. Instead of a single pair of cross-coupled driver transistors forming the bistable circuit, dual parallel pairs are used. One pair used in the initial sensing has a long channel length so that the pair may be more readily matched, while the other pair used later in the cycle for driving the zero-going side of the column line to ground has a shorter channel to enhance speed.

11 Claims, 4 Drawing Figures

SENSE AMPLIFIER WITH DUAL PARALLEL DRIVER TRANSISTORS IN MOS RANDOM ACCESS MEMORY

BACKGROUND OF THE INVENTION

This invention relates to semiconductor memory devices, and more particularly to an improved sense amplifier for an N-channel MOS memory device of the type employing one-transistor memory cells.

MOS random access memory (RAM) devices are becoming more widely used in the manufacture of digital equipment, particularly minicomputers, as the speed and cost advantages of these devices increase. The cost per bit of storage using MOS RAMs has gone down as the number of bits or memory cells per package goes up. A RAM containing 4096 bits, for example, is shown in U.S. Pat. No. 3,940,747 issued Feb. 24, 1976 to Kuo and Kitagawa, assigned to Texas Instruments, 16,384 bit or "16K" RAMs are described in articles in *Electronics,* Feb. 19, 1976, pp. 116–121, and May 13, 1976, pp. 81–86, and 64K RAMs will soon be available. As the number of bits increases, the cell size decreases, the magnitude of the storage capacitor in each cell of necessity decreases, and the capacitance of the digit lines increase. These factors reduce the magnitude of the data signal which exists on a digit line. A full logic level, i.e., the difference between a "1" and a "0", in one of these devices may be perhaps 5 v.; however, the difference in voltage between a "1" and a "0" for the data coupled to a digit line in the memory array from the selected one-transistor cell may be only fifty millivolts. Prior circuits for sensing these low-level signals are shown in U.S. Pat. No. 3,940,747 and the *Electronics,* Sept. 13, 1973, Vol. 46, No. 19, pp. 116–121, and *IEEE Journal of Solid State Circuits,* Oct., 1972, p. 336, by Stein et al, as well as U.S. patent application Ser. No. 682,687 filed May 3, 1976 by Kitagawa and McAlexander, and U.S. Pat. No. 4,081,701, issued Apr. 28, 1978, to White, McAdams and Redwine, assigned to Texas Instruments.

As memory devices require higher packing density, higher speed, and lower power dissipation, the sense amplifiers become more critical. Some prior circuits exhibit high power dissipation and overly long charging times for the digit lines, while others require high instantaneous current and critical clock timing. One of the problems has been in exactly matching the two cross-coupled driver transistors; the threshold can best be matched in long channel transistors; but this causes excessive discharge time for the zero-going side of the column line.

It is a principal object of this invention to provide an improved sense amplifier for an MOS RAM, and in particular a sense amplifier which is of high speed operation, as well as high sensitivity.

BRIEF SUMMARY OF THE INVENTION

In accordance with the invention, a MOS RAM using one-transistor cell employs a sense amplifier of the type having two parallel pairs of cross-coupled driver transistors connected as a bistable circuit, at the center of each column line in the memory array. The pairs of driver transistors are of different channel lengths, and are connected to ground through two different paths provided by two transistors which are clocked on at different times. During an initial sensing period, the current through a first of the pairs of driver transistors is controlling, and is kept low, then the other pair is controlling and is allowed to be higher during a later time so that an output of full logic level is produced. The first pair has long channel lengths which can be more precisely matched, and the second pair has shorter channels for high current.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjunction with the accompanying drawings, wherein:

DETAILED DESCRIPTION OF SPECIFIC EMBODIMENT

Figure 1:
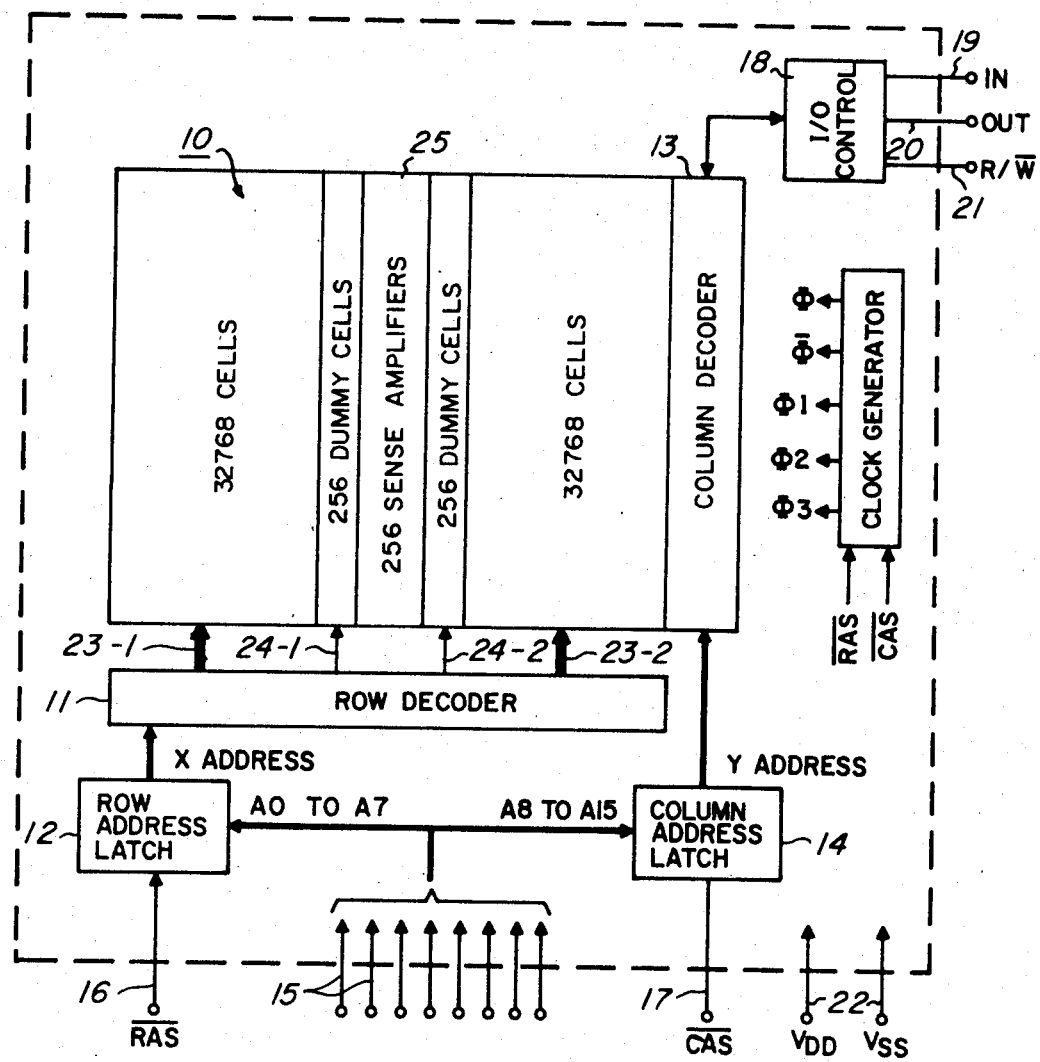
FIG. 1 is a block diagram of a semiconductor memory device which may utilize the invention.

Referring to FIG. 1, an MOS memory device which may use the invention is illustrated. In one example, the invention is used in a very high density memory containing 65,536 cells on one silicon chip of about 150 mils on a side, made by an N-channel silicon-gate self-aligned MOS process which is described in U.S. patent application Ser. No. 648,594, filed Jan. 12, 1976 by C-K Kuo for MOS Memory Cell Using Double Level Polysilicon, assigned to Texas Instruments. The device consists of an array 10 of 65,536 memory cells which is generaly divided into 256 rows and 256 columns; each cell is a so-called one-transistor cell of the type shown in said application Ser. No. 648,594. A row decoder 11 selects one of the 256 row lines as determined by a row or X address contained in an eight bit row address buffer or latch 12, and a column decoder 13 selects one of the 256 column lines as determined by a column or Y address contained in an eight-bit column address buffer 14. These addresses are applied to the chip by eight address lines 15, on a time-share basis. An RAS or row address strobe input 16 (see in FIG. 3*g*) enables the row address buffer 12 when RAS is at zero volts. When the buffer 12 is enabled it accepts and stores a row address, which includes address bits A0 to A7. In like manner a CAS or column address strobe input 17 (see in FIG. 3*h*) when at zero enables the column address buffer to accept a column address (bits A8 to A15) from the lines 15. The row and column addresses must be valid on the pins 15 during the time periods shown in FIG. 3*f.* Sixteen address bits are needed to uniquely define one bit of 65,536 cells (2$^{16}$=65,536). Input/output control circuitry 18 is connected to the array 10 via column decode 13, and functions to apply data to the column lines from a data input pin 19, or to detect data on the column lines and apply it to a data output pin 20, under control of a read/write R/W input 21 as well as under control of various internally generated clock and logic voltages. The supply voltage Vdd and ground or Vss are applied on pins 22; a substrate bias voltage Vbb is generated on the chip. The memory device of FIG. 1 is in the form of a small silicon chip mounted in a DIP package which has sixteen pins corresponding to the sixteen input and output lines mentioned above.

Figure 3:
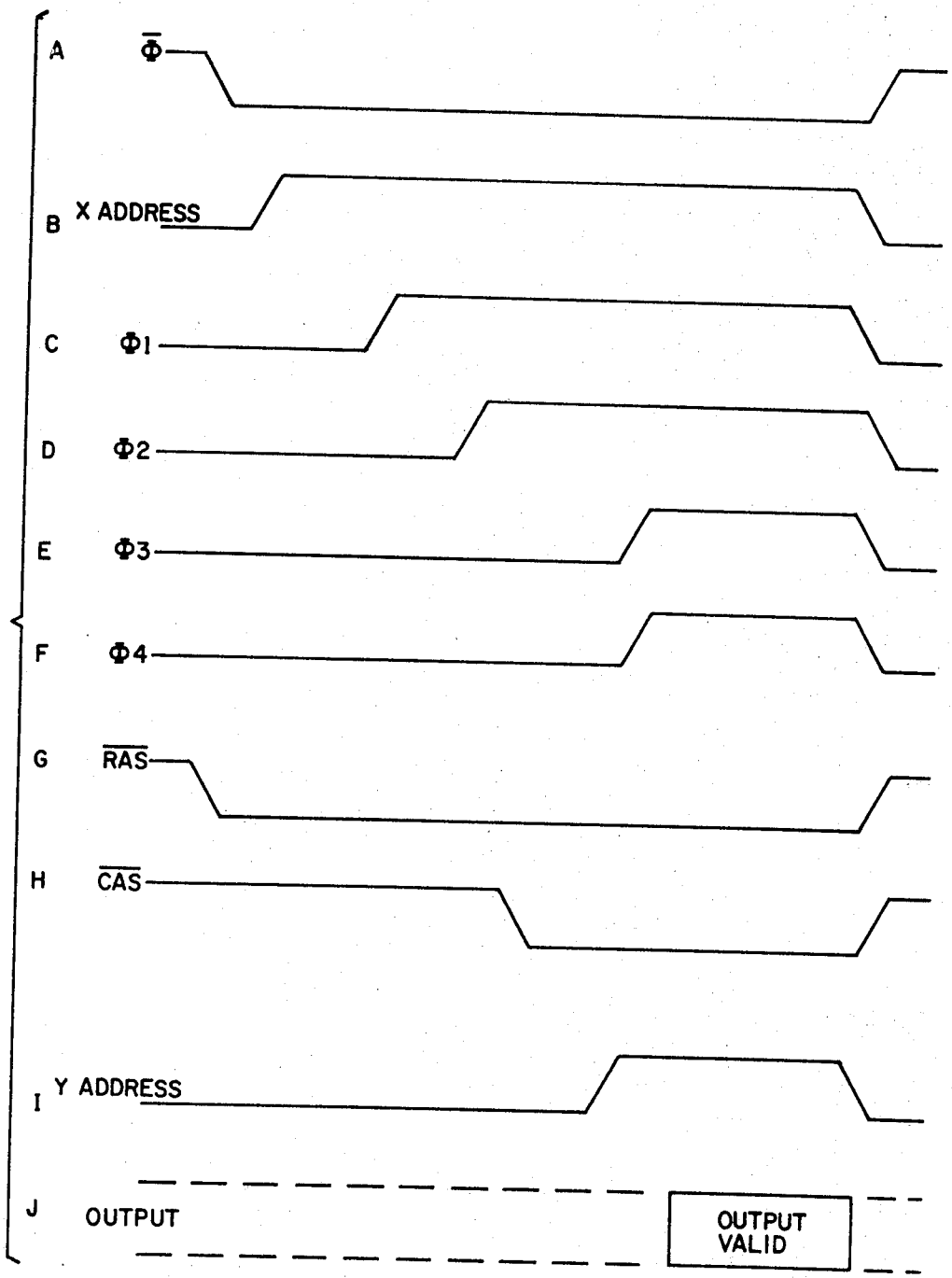
FIGS. 3*a*–3*j* are graphic representations of voltages appearing at various points in the system of the invention, plotted as a function of time.

The decoder 11, of the conventional design, functions to select one out of the 128 row lines 23-1 on the left side or one of the 128 row lines 23-2 on the right side. A row line is a metal line which extends along most of the width of the chip and drives the gates of 256 MOS transistors in the 256 memory cells associated with this row. The eight address bits A0 to A7 in row decoder 11 select one row line 23 out of 256 to go high, the remaining 256 remain low. The row address exists (referred to as X in FIGS. 3b and 4) on the selected one of the line 23 during the RAS time as seen in FIG. 3g. A7 selects either left or right side, i.e., permits activation of either lines 23-1 or lines 23-2. Then the seven bits of A0 to A6 will select one of the 128 lines in the selected half. A7 will also determine activation of dummy cells in the unselected side via dummy cell address lines 24-1 or 24-2, during RAS, as is conventional.

In accordance with the invention, the memory device of FIG. 1 contains improved sense amplifiers 25 in the center of each column line. The sense amplifiers are for the purpose of detecting the low signal created on the selected column line when a cell is addressed and converting this low signal to a full logic level.

Figure 2:
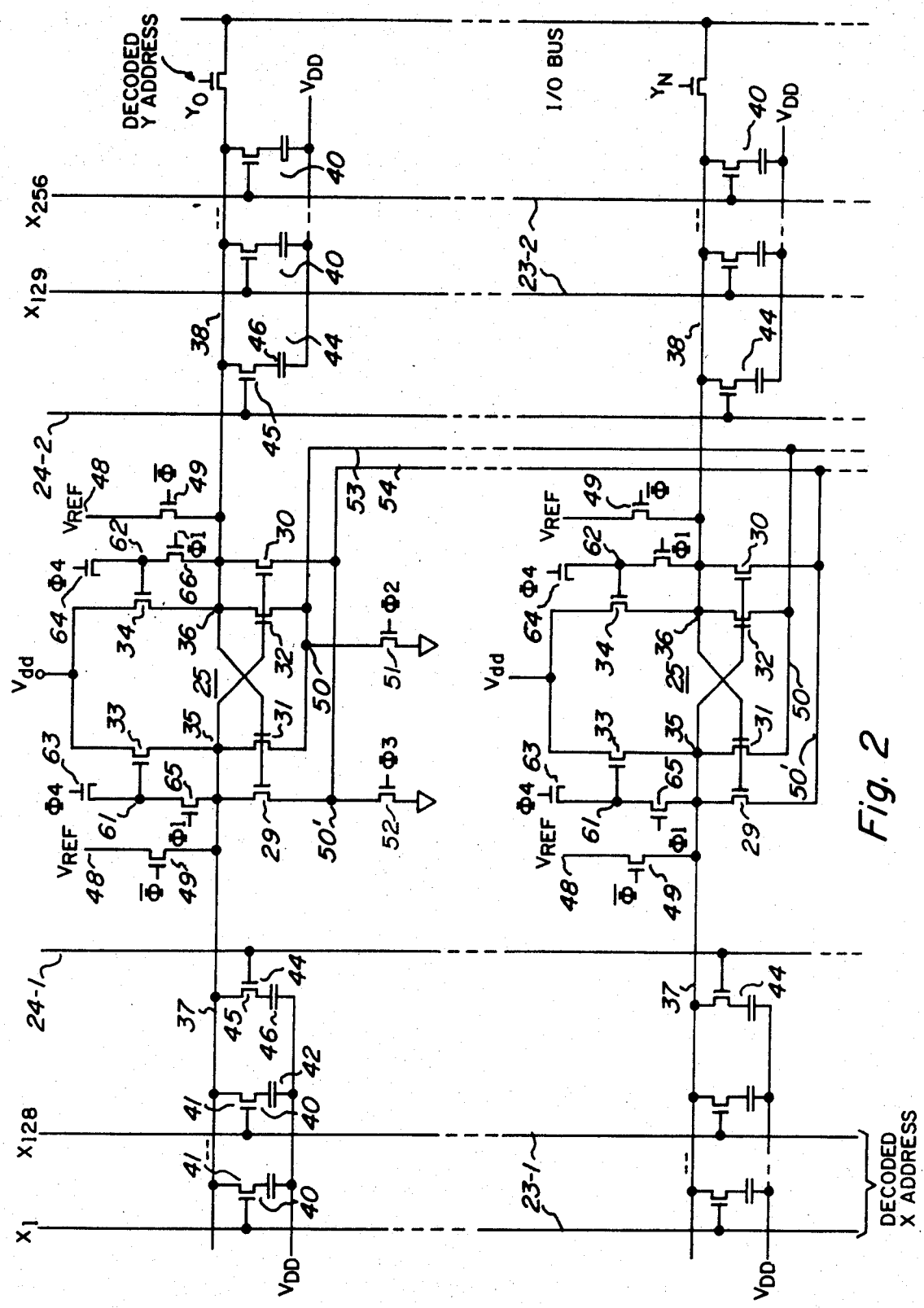
FIG. 2 is an electrical schematic diagram of an array of memory cells for the system of FIG. 1, employing the sense amplifiers of the invention.

Referring to FIG. 2, a sense amplifier 25 according to the invention is illustrated in a part of the array. The sense amplifier 25 basically consists of a flip-flop or bistable circuit having a first pair of cross-coupled driver transistors 29 and 30 and a second pair of device transistors 31 and 32 are connected with load transistors 33 and 34. A pair of sense nodes 35 and 36 are connected to the respective halves 37 and 38 of a column line. These nodes 35 and 36 are connected to the gates of the opposite transistors 29 and 31 or 30 and 32 to provide the cross-coupled arrangement.

The line 37, half of a column line, has 128 cells 40 connected to it, as does the line 38. Each cell consists of a transistor 41 and a capacitor 42; the gate of each transistor 41 is controlled by a row line 23-1 or 23-2 (the row line is also referred to as a word line or an X line), and each row line is connected to 256 gates for like transistors 41. In the array 10 of this embodiment, there are 128 row lines on each side of the sense amplifiers 29, and, of course, there are 256 sense amplifiers 29, so only a very small part of the array 10 is seen in FIG. 2. Each sense amplifier has two dummy cells 44, one on each side, connected to the column lines 37 and 38. The dummy cells are like the storage cells 40, and each includes a transistor 45 and a capacitor 46. Lines 24-1 and 24-2 function to turn on the transistor 45 in the row of dummy cells on the opposite side of the sense amplifier from the selected cell 40 (as defined by bit A7 of the row address) at the same time the selected storage cell 40 is addressed.

Each column line 37 or 38 is connected to a reference voltage line 48 through a transistor 49, with the gates of these transistors being driven by $\Phi$; this functions to charge the lines 37 and 38 equally to a reference voltage level selected to be Vdd or slightly below Vdd. The $\Phi$ clock applied to the gates of the transistors 49 may be higher than Vdd so that the column lines charge to a full Vdd level. The load transistors 33 and 34 are connected to Vdd and are controlled as described below. The part of the flip-flop circuit including the transistors 31 and 32 begins to function before the transistors 33 and 34 are rendered conductive, when a node 50 connected to the sources of the transistors is first coupled to ground at $\Phi 2$ by a transistor 51. A node 50' connected to the sources of the transistors 29 and 30 is coupled to ground at $\Phi 3$ by a transistor 52.

In accordance with the invention disclosed and claimed in copending application Ser. No. 682,687 filed May 3, 1976, by Kitagawa and McAlexander, the nodes 50 and 50' are grounded through separate paths including in this case the two transistors 51 and 52 which are controlled by clocks $\Phi 2$ and $\Phi 3$. The transistors 51 and 52 are of different sizes so the amount of current drawn by these transistors from the nodes 50 and 50' to Vss or ground is different. Transistor 51 is the smallest and transistor 52 is about twice its size, measured in device ratio or width to length of the channel. All 256 of the sense amplifiers 25 in the array 10 share the same pair of transistors 51 and 52; a pair of lines 53 and 54 connect together the nodes 50 or 50' of all these sense amplifiers.

The advantage of having two separate sets of driver transistors 29 and 30 or 31 and 32 in the flip-flop is that the transistors 31 and 32 used for initial sensing can be of different size than the transistors 29 and 30 used for completing the sense operation and driving the zero-going column line to ground. The channel length of the transistors 31 and 32 is greater than ten microns, so the difference in channel length caused by process variations will be much smaller, in proportion, than for short channel transistors. A difference in channel length causes a difference in threshold voltage, which would result in a minimum resolving power or sensitivity of the sense amplifier greater than if the two transistors were exactly matched. However, a long channel transistor will slow the operation of the circuit because of its added impedance in the discharge path of the zero-going column line. Thus, the transistors 29 and 30, turned on later in the sense cycle, will function to discharge the side of the column line which is going to zero, and since the channel length of these transistors can be much shorter the discharge time will be short. It is not important that the transistors 29 and 30 be exactly balanced in threshold voltage because by the time these transistors take over the voltage separation on the two column line halves is perhaps a half volt, more or less. In contrast, the transistors 31 and 32 must detect a voltage difference of as little as perhaps thirty to fifty millivolts. The transistors 29 and 30 are, for example, thirty microns or more in width and less than seven, perhaps about five, microns in length.

When a clock $\Phi 2$ (seen in FIG. 3c) goes positive, a sense operation is initiated, and the flip-flop will tend to go toward a stable condition where either transistor 31 is conductive and transistor 32 is cut off, or vice versa. The direction of switching will depend upon the voltage difference between lines 37 and 38 which depends upon whether a one or zero was stored in the selected cell 40. Since one of the lines 37 or 38 will be at a slightly higher voltage than the other, one of the transistors 31 or 32 will have a slightly higher voltage on its gate than the other, and thus when $\Phi 2$ goes positive one transistor will tend to conduct slightly more current than the other.

A sense amplifier such as that of FIG. 2 provides higher speed operation if the precharged voltage on the column lines 37 or 38 on the side which is to stay at "1" logic level tends to stay high during the initial sensing period, i.e., when $\Phi 2$ is on but before $\Phi 3$ comes high. That is, it is important that the charging time of the digit lines 37 or 38 to refresh a "1" level be a minimum, and this is accomplished by preventing the node of the sense amplifier which is to stay at the "1" level from discharging to a low voltage during the initial sense operation.

Figure 4:
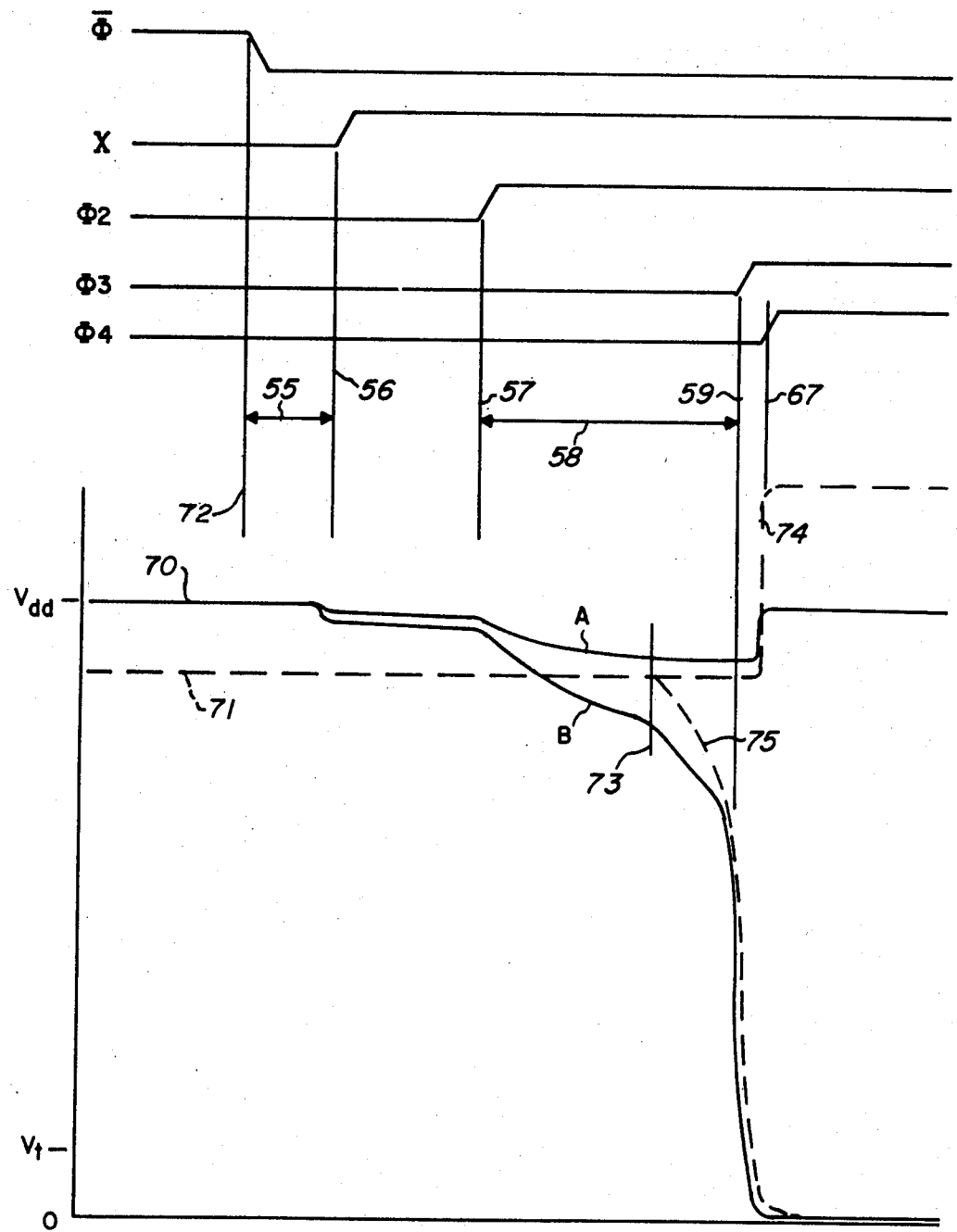
FIG. 4 is a detailed graphic representation of voltage versus time for the digit lines in the circuit of FIG. 2.

Referring to FIG. 4, the voltage on the column line halves 37 and 38 is shown in enlarged view as a function of time as the clock Φ2 comes on. During the time 55, before the address actuates one of the row lines 23-1 or 23-2 and before Φ2 goes high, the voltage on the column lines 37 and 38 is equalized at about Vdd as defined by charging from the line 48. At a time 56, one of the lines 23-1 or 23-2 goes high, and the voltages on the lines 37 and 38 separate very slightly, perhaps fifty millivolts, due to one of the storage capacitors 46 (smaller than 42) being connected to the line. At time 57, Φ2 goes high and one of the lines 37 or 38 begins to discharge toward a "0" level during an interval 58 while the other discharges only slightly, not over about one volt, as seen by lines A and B. In the time interval 58, prior to the time when Φ3 comes on, if a "1" was stored the transistor 31 or 32 opposite the selected cell will conduct more than the one opposite the dummy cell. If a "0" is stored, the reverse is true.

In accordance with the U.S. Pat. No. 4,081,701 mentioned above, the sense amplifier 25 of FIG. 2 includes an arrangement for controlling conductance of the load transistors 33 and 34 when Φ3 goes high. Nodes 61 and 62 at the gates of the load transistors 33 and 34 are connected to the clock Φ4 source via gated capacitors 63 and 64, and are also connected to the column lines 37 and 38 via transistors 65 and 66 which have their gates connected to Φ1. The capacitors 63 and 64 act as "booting" or bootstrap capacitors and produce a high drive voltage on the gate of one of the load transistors 33 and 34. This permits rapid charging of the digit line which is to be restored to the "1" level, as seen by the line A of FIG. 4, and this, of course, speeds the restoration of the "1" level voltage in the selected storage cell 40. The transistors 65 and 66 provide for discharge of the driving voltage on one of the nodes 61 or 62 at the gate of the load transistor on the zero-going side of the sense amplifier. This reduces the power consumption of the sense amplifier and improves operating speed.

During Φ, seen in FIGS. 3a and 4, the lines 37 and 38 (nodes 35 and 36) are precharged to a level 70 which is about Vdd while X, Φ1, Φ2, Φ3 and Φ4 are zero; the nodes 61 and 62 will be charged through transistors 65 and 66 to a level 71 during that period. The level 71 differs from the level 70 by the drop across the transistor 65 or 66, so it is about (Vdd-Vt). When Φ goes to zero at time 72, the digit lines 37 and 38 are isolated from Vdd, and Φ1 goes high, so the transistors 65 and 66 could now provide discharge paths so that the charge on the node 61 or 62 and on the booting capacitor 63 or 64 that is connected to the one-going side of the sense amplifier is not discharged as the voltage on the digit line falls during sensing. As the voltage differential between the digit lines 37 and 38 is established by charge sharing of the dummy cell capacitance 46 and the storage cell capacitance 42, after the selected X line 23-1 or 23-2 goes high and the dummy cell select line 24-1 or 24-2 goes high, the operation is as mentioned above with reference to the interval 58 of FIG. 4. As Φ2 goes high at time 57, amplification of the voltage difference begins. The initial level 71 of the voltage on nodes 61 and 62 is maintained until time 67 in FIG. 4 because during the first part of the interval 58 the nodes 35 and 36 have dropped slightly as seen by lines A and B, so the gate-to-source voltage for each transistor is less than Vt and transistors 65 and 66 cannot turn on. When Φ4 goes high at a time 67, this will tend to boot the voltage (line 74) on the gates of the load devices 33 and 34 or the nodes 61 and 62 via capacitors 63 and 64. At the time 59, Φ3 will have turned on the transistor 52 and increased the rate of the discharge of the zero-going side as seen by the line B of FIG. 4. At a time 73 when the digit line voltage on the zero-going side drops one Vt below the instantaneous level on the node 61 or 62, the sensing operation is essentially complete and one of the transistors 65 or 66 will turn on and begin discharging the voltage on node 61 or 62 or on the booting capacitor 63 or 64 for this side, thus turning off the corresponding load device 33 or 34. At this point, the voltages on nodes 61 and 62 separate as lines 74 and 75 in FIG. 4.

For example, if we assume that the node 35 is the zero-going side (a selected cell on column line 37 stores a zero or a selected cell on column line 38 stores a one), when X goes high, beginning at time interval 56 the voltage at node 35 will go to a level slightly less than the voltage on node 36, i.e., node 36 will correspond to line A, of FIG. 4 and node 35 to line B. Beginning at time 57 when Φ2 goes high, the voltage difference between nodes 35 and 36 is amplified during the time period 58, but the node 35 has not yet dropped one Vt below the node 61. When Φ3 goes high at time 59, the amplification of the voltage difference between A and B is increased and the node 36 rapidly begins charging toward Vdd through the transistor 34, while node 35 discharges rapidly toward Vss through transistors 31, 51 and 52. At time instant 7 the node 35 has fallen one Vt below the node 61 and the transistor 65 will turn on and node 61 will discharge rapidly toward Vss as seen by line 75. The sensitivity of the circuit is not decreased since the node 61 and 62 voltages remain trapped at level 71 until sensing is completed at occurance of Vt split between digit lines.

A speed vs. power trade off exists in the selection of the timing of clocks applied to the transistor 52 and the booting capacitors 63 and 64. If Φ4 as applied to the booting capacitors 63 and 64 is delayed slightly, compared to Φ3 applied to the transistor 52, so that the zero-going digit line voltage B is more than one Vt below level 71, then the load device for that digit line is never turned on and only the discharging of the stored energy of the digit line capacitance consumes power. However, too much delaying in Φ4 may cause the access time of the device to be increased. Use of no delay in Φ4 provides the fastest access time, but power consumption might be increased a negligable amount since the load device of the zero-going side is turned on for a short period as discussed above.

Although the invention has been described with reference to a specific embodiment, this description is not meant to be construed in a limiting sense. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A memory system of the type having an array of rows and columns of memory cells and a plurality of sense amplifiers, the sense amplifiers having inputs connected to each column, each sense amplifier comprising first and second pairs of cross-coupled driver transistors with each of such transistors having a source-to-drain path and a gate, each of the first pair of driver transistors having one end of its source-to-drain path directly cross connected to the gates of the other of said first and second pairs, each of the second pair of driver transistors having one end of its source-to-drain path directly cross connected to the gates of the other of said first and second pairs, the gates of the opposing transistors of the first and second pairs having the same voltages thereon throughout an operating cycle of the memory system, said one ends of the source-to-drain paths of both said first and second pairs being coupled together and to said columns whereby the source-to-drain paths of the first pair of driver transistors are in parallel with the source-to-drain paths of the second pair of driver transistors, means separately connecting the other ends of said source-to-drain paths of each of the first and second pairs of driver transistors to reference potential to render the first pair conductive prior to a selected time in an operating cycle and both the first and second pair conductive after said selected time in an operating cycle.

2. Apparatus according to claim 1 wherein the pair of driver transistors are field effect transistors each having a channel as a source-drain current path and wherein the length of the channels of the first pair are matched and longer than the lengths of the channels of the second pair to minimize the effects of threshold voltage and gain unbalance in the first pair.

3. Apparatus according to claim 2 wherein the said means include first and second MOS transistors for connecting one end of the first and second pairs of driver transistors to reference potential, and such first and second MOS transistors are sequentially actuated during an operating cycle.

4. Apparatus according to claim 3 wherein the per bit ratio of width to length of the channel of the first MOS transistor is small compared to that of the channels of the driver transistors, and wherein said first MOS transistor is turned on during a given time prior to said selected time during an operating cycle.

5. A sense amplifier for a semiconductor memory comprising first and second pairs of cross-coupled driver transistors and a pair of load transistors, each of said transistors having a current path and a control electrode, the current paths of the load transistors serially connecting the one end of the current paths of the pairs of driver transistors separately to a supply voltage, said one end of each of said current paths in each of the pairs of driver transistors being directly cross connected to the control electrode of the other driver transistor in the respective pair during all of an operating cycle, the other ends of each pair of driver transistors being separately connected to reference potential through one of a pair of coupling means to render the first pair conductive prior to a selected time in an operating cycle and both the first and second pair conductive after said selected time in an operating cycle.

6. A sense amplifier according to claim 5 wherein a first of the pairs of driver transistors has matched channel lengths, and said matched channel lengths are longer than the channel lengths of the other pair of driver transistors.

7. A sense amplifier according to claim 6 wherein the pair of coupling means includes two separate control transistors connecting said other ends of the current paths of the pairs of driver transistors to reference potential, control voltage generator means is provided to actuate one of the control transistors at a first time in an operating cycle and to activate the other of the control transistors at a selected second time later than the first time in each operating cycle.

8. A sense amplifier according to claim 7 wherein said one of the control transistors of said pair of coupling means is connected to the other of the pairs of driver transistors and conducts much less current than the other of the control transistors.

9. A sense amplifier according to claim 8 wherein the driver transistors, the load transistors, and the control transistors are all MOS transistors.

10. A sense amplifier according to claim 7 wherein capacitor means separately couples a clock voltage source to the control electrodes of the load transistors, said source producing a clock voltage at about the said second time in each operating cycle.

11. A sense amplifier according to claim 10 wherein means are provided for precharging said one ends of the current paths of the pairs of driver transistors, at a time prior to said first time in such operating cycle.

* * * * *